United States Patent [19]

Hsiao et al.

[11] Patent Number: 5,349,305
[45] Date of Patent: Sep. 20, 1994

[54] FULLY DIFFERENTIAL CURRENT SAMPLE/HOLD CIRCUIT

[75] Inventors: Chun-Fang Hsiao; Chung-Yu Wu; Chin-Cheng Chen, all of Hsin, Taiwan

[73] Assignee: United Microelectronics Corporation, Hsinchu, Taiwan

[21] Appl. No.: 94,975

[22] Filed: Jul. 22, 1993

[51] Int. Cl.⁵ ............................................. H03F 3/45
[52] U.S. Cl. ................................. 330/253; 330/258; 330/257; 307/494; 307/497
[58] Field of Search .............. 307/353, 352, 355, 494, 307/497; 330/258, 257, 253, 259

[56] References Cited

U.S. PATENT DOCUMENTS 5,182,560  1/1993  Shiwaku ............................ 330/258
5,216,380  6/1993  Carbou ............................. 330/253

OTHER PUBLICATIONS

Rajesh H. Zele, D. J. Allost & T. S. Fiez, "Fully-Differential CMOS Current Mode Circuits & Applications", Proc. of the 1991 IEEE International Symposium Circuits & Systems, pp. 1817–1820.

S. J. Daubert & D. Vallancart, "A Transistor-Only Current-Mode Sigma-Delta Modulator," IEEE Journal of Solid State Circuits, vol. 25, No. 3, pp. 699–706.

Primary Examiner—William L. Sikes
Assistant Examiner—Jim Dudek
Attorney, Agent, or Firm—George O. Saile; Graham S. Jones, II

[57] ABSTRACT

A sampled-data, current-mode circuit implements analog functions in a standard digital process. Among sampled-data current-mode circuits, the current S/H (CSH) circuit is a key component. This fully differential CSH circuit was implemented in a 1.2 μm N-well double-poly double metal CMOS technology adapted to 8-bit resolution at a 15 MHz sampling rate.

19 Claims, 2 Drawing Sheets

FULLY DIFFERENTIAL CURRENT SAMPLE/HOLD CIRCUIT

BACKGROUND OF THE INVENTION

1. Field of the Invention

This invention relates to current-mode circuits and more particularly to sample hold circuits for current-mode circuits.

2. Description of Related Art

The "current sample/hold" (CSH) circuit proposed by Rajesh H. Zele, D. J. Allost and T. S. Fiez "Fully-Differential CMOS Current-Mode Circuits and Applications", Proc. of the 1991 IEEE International Symposium Circuits and Systems, pp. 1817–1820 has the potential disadvantage that the current gain is determined by two current mirrors (only the output mirror branch is of the cascode structure.) Consequently, the current gain is less accurate than that of the single balances cascode current mirror (the master and slave branches are all of the cascode structure.) Since the common-mode current signal is cancelled at the output branch by current mirroring, this will lead to more power consumption, when multiple current outputs are required.

A cascode circuit structure as used herein refers to a circuit arrangement to have two active devices stacked, e.g. two MOS transistors, with the drain of the lower transistor being arranged to feed the source of the upper transistor. The cascode circuit is often employed to obtain a high output resistance without using long channel devices.

In the CSH circuit of S. J. Daubert and D. Vallancourt, "A Transistor-Only Current-Mode Sigma-Delta Modulator", IEEE Journal of Solid-State Circuits, Vol. 25, No. 3, pp. 669–706 (June 1990), the common-mode current signal is removed by the common-mode feedback to stabilize the output voltages. Because the common mode feedback loop gain is not large enough, the achievable linear common-mode current input range is quite limited. At the output nodes the common-mode output current strongly depends on the common-mode voltage level. This will impose some limitations when applying this circuit to drive different loads. In addition, the common-mode feedback circuits must be duplicated when multiple current outputs are needed. This implies more circuit complexity, chip area and power consumption.

SUMMARY OF THE INVENTION

An electronic system comprises
a) a pair of input nodes,
b) common mode amplifier means having a pair of input lines with each one connected to one of the input nodes, the common mode amplifier means having a single output,
c) differential voltage amplifier means having a pair of input lines each being connected to one of the input nodes, the differential amplifier means having a first output line with a negative polarity and a second output line with a positive polarity,
d) a first pair of current source circuits including a first current source circuit and a second current source circuit with the output of the common mode amplifier means being connected to a corresponding input of each of the first and second current source circuits, a second pair of current circuits including a third current source circuit and a fourth source current circuit,
e) the first output line of the differential amplifier means with a negative polarity being connected to the third current source circuit, and
f) the second output line of the differential amplifier means with the positive polarity being connected to an input of the fourth current source circuit, whereby the common mode signal is rejected at the input nodes.

Preferably, each of the input nodes is connected through a switch to one of a set of signal sources.

In another aspect of the invention, an electronic system comprises
a) a pair of input nodes for carrying input current,
b) common mode amplifier means having a pair of input lines with each one connected to one of the input nodes, the common mode amplifier means having a single output,
c) differential voltage amplifier means having a pair of input lines each being connected to one of the input nodes, the differential amplifier means providing outputs on first and second output lines with absolute values varying as a function of the voltage difference between the input nodes, the first output line having an output with a negative polarity and the second output line having an output with a positive polarity,
d) a pair of current source circuits including a first current source circuit and a second current source circuit with the output of the common mode amplifier means being connected to a corresponding input of each of the first and second current source circuits,
e) the first output line of the differential amplifier means with the negative polarity being connected to a second input of the first current source circuit, and
f) the second output line of the differential amplifier means with the positive polarity being connected to a second input of the second current source circuit, whereby the common mode signal is rejected at the input nodes whereby the common mode signal is rejected at the input.

Preferably, each of the input nodes is connected through a switch to one of a set of signal sources.

Preferably, each of the input nodes is connected to one of a set of current sources including a PMOS and an NMOS cascode current source connected in series, and with the PMOS cascode current sources having inputs connected to the output of the common mode amplifier.

Preferably, each of the input nodes is connected to one of a set of current sources including a PMOS and an NMOS cascode current source connected in series, and with the PMOS cascode current sources having inputs connected to the output of the common mode amplifier and with the NMOS cascode current sources having inputs connected to the opposite outputs of the differential voltage amplifier.

Preferably, each of the input nodes is connected to one of a set of current sources including a PMOS and an NMOS cascode current source connected in series, and with the PMOS cascode current sources having inputs connected to the output of the common mode amplifier and with the NMOS cascode current sources having inputs connected to the opposite outputs of the differential voltage amplifier.

In still another aspect of the invention, an electronic system comprises
a) a pair of input nodes for carrying input current,
b) common mode amplifier means having a pair of input lines with each one connected to one of the input nodes, the common mode amplifier means having a single output, c) differential voltage amplifier means having a pair of input lines each being connected to one of the input nodes, the differential amplifier means providing outputs on first and second output lines with absolute values varying as a function of the voltage difference between the input nodes, the first output line having an output with a negative polarity and the second output line having an output with a positive polarity, d) a pair of current source circuits including a first current source circuit and a second current source circuit with the output of the common mode amplifier means being connected to a corresponding input of each of the first and second current source circuits, e) the first output line of the differential amplifier means with the negative polarity being connected to an input of the first current source circuit, f) the second output line of the differential amplifier means with the positive polarity being connected to an input of the second current source circuit;

g) each of the input nodes is connected to one of a set of current sources, and h) each of the output lines from the differential voltage amplifier is connected to provide one of a set of output current sources and at least one set of output current sources for supplying at least one output load, whereby the common mode signal is rejected at the input.

Preferably, each of the input nodes is connected to one of a set of current sources including a PMOS and an NMOS cascode current source connected in series.

It is also preferred that each of the output lines is connected to one of a set of current sources including a PMOS and an NMOS cascode current source connected in series.

Preferably, each of the output lines is connected to one of a set of current sources including a PMOS and an NMOS cascode current source connected in series; each of the input nodes is connected to one of a set of current sources including a PMOS and NMOS cascode current source connected in series, and the PMOS cascode current sources has inputs connected to the output of the common mode amplifier; each of the output lines is connected to one of a set of current sources including a PMOS and an NMOS cascode current source connected in series.

Preferably, each of the input nodes is connected to one of a set of current sources including a PMOS and an NMOS cascode current source connected in series, and with the PMOS cascode current sources having inputs connected to the output of the common mode amplifier and with the NMOS cascode current sources having inputs connected to the opposite outputs of the differential voltage amplifier.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

The increased use of digital signal processing in CMOS integrated circuits has led to the strong motivation to implement analog circuits in standard digital CMOS technologies. Current-mode circuits can be designed exclusively with transistors, making them fully compatible with most digital processes. For most data acquisition systems, the "sample/hold" (S/H) circuit often plays an important role which may place speed-/accuracy limitations on the system performance. Herein, a new high speed, fully differentiated, current S/H (CSH) circuit is provided.

This current S/H (CSH) circuit is of fully differential architecture having a larger dynamic range and higher immunity against clock-feedthrough noise and power supply variations. A new current-mode, common-mode feedback scheme provides the common-mode rejection required for the fully differential architecture. Multiple current outputs can be obtained by simply adding extra mirror-transistors. The circuit has only one significant pole located at the input node, so its settling behavior is good and its sampling rate is high. Since MOS transistors are the only devices used in the circuit, it can be fabricated employing a standard digital CMOS process. The accuracy is limited mainly by the matching between mirror-transistors during the fabricating process.

Figure 1:
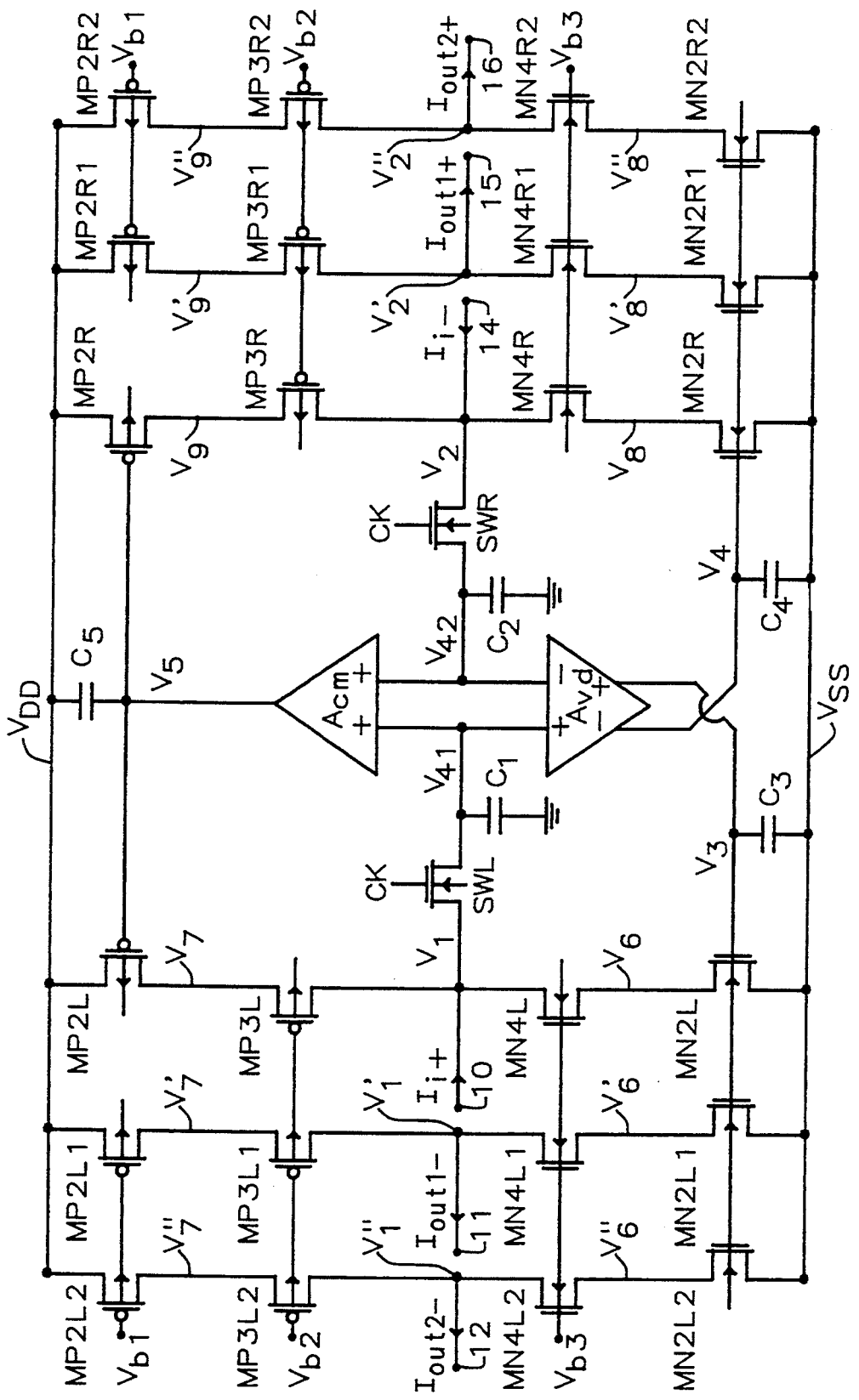
FIG. 1 shows a partially schematic circuit diagram of a current sample/hold (CSH) circuit comprising the preferred embodiment of this invention.

FIG. 1 shows a partially schematic circuit diagram of the CSH circuit comprising the preferred embodiment of this invention, which is composed of three sections. There are two current mirrors, on the left and on the right, and a set of voltage amplifiers $A_{cm}$ and $A_{vd}$ in the middle between nodes $V_5$, $V_{41}$, $V_{42}$, $V_3$, and $V_4$. The lines $V_{DD}$ and $V_{SS}$ are the positive and negative power rails, respectively. The lines $V_{b1}$, $V_{b2}$, and $V_{b3}$ are bias voltages generated by a bias circuit. The values of these bias voltages must be designed to have the transistors connected to them working in the appropriate region, as will be well understood by those skilled in the art. The transistor switches SWL and SWR, which are embodied by NMOS transistors, are connected between nodes V1 and V41 in the case of transistor SWL and nodes V42 and V2 in the case of transistor SWR. Input signal CK, which is connected to the gates of transistor switches SWL and SWR, is the control signal to toggle the transistor switches SWL and SWR. (In case in which less switch induced error is required, a CMOS transmission gate can be used as an implementation of the switches SWL and SWR.) Terminals 10 and 14 are connected by lines to nodes $V_1$ and $V_2$ respectively to supply currents $I_{i+}$ and $I_{i-}$ to those nodes. The currents $I_{i+}$ and $I_{i-}$ from terminals 10 and 14 to nodes $V_1$ and $V_2$ are the current input pair to the CSH circuit. Currents $I_{out1-}$ (from node $V_1'$ to terminal 11) and $I_{out1+}$ (from node $V_2'$ to terminal 15) are the differential current output pair generated from the CSH circuit to drive an output load. Current $I_{out2-}$ (on a line from node $V_1''$ to terminal 12) and current $I_{out\,2+}$ (on a line from node $V_2''$ to terminal 16) are another differential current output pair to drive another output load.

The capacitors $C_1$, $C_2$, $C_3$, $C_4$, $C_5$ are the capacitance loads (including the stray capacitance) associated with nodes $V_{41}$, $V_{42}$, $V_3$, $V_4$, and $V_5$ respectively. Capacitor $C_1$ is connected between node $V_{41}$ and reference potential. Capacitor $C_2$ is connected between node $V_{42}$ and reference potential. Capacitor $C_3$ is connected between node $V_3$ and the $V_{SS}$ rail whereas on the right side of the circuit, capacitor $C_4$ is connected between node $V_4$ and the $V_{SS}$ rail. Between node $V_5$ and the $V_{DD}$ rail, the upper capacitor $C_5$ is connected.

The amplifier $A_{vd}$ is a differential, unity gain voltage amplifier with a differential input pair connected to nodes $V_{41}$ and $V_{42}$ and a differential output pair connected to nodes $V_3$ and $V_4$. The amplifier $A_{vd}$ amplifies only the differential part between its two inputs $V_{41}$ and $V_{42}$ and rejects the common-mode part. The difference between the two inputs is called the differential part and the common-mode means the average value of the two input signals. The positive input of the amplifier $A_{vd}$, which is connected to node $V_{41}$ is connected therefrom to one end of transistor switch SWL. The negative input of amplifier $A_{vd}$ is connected to node $V_{42}$ which is connected to one terminal of transistor switch SWR. The positive output of amplifier $A_{vd}$ is connected via node $V_3$ to the gate of NMOS transistor MN2L, (where the "N" after the "M" signifies a N-channel device here and hereinbelow.) as well as the gates of transistors MN2L1 and MN2L2. The negative output of amplifier $A_{vd}$ is connected to node $V_4$ which is connected to the gate of NMOS transistor MN2R, as well as the gates of transistors MN2R1 and MN2R2.

The amplifier $A_{cm}$ is a common-mode unity gain voltage amplifier with a pair of inputs. The two inputs thereof are both positive and the left input thereof is connected to node $V_{41}$ and node $V_{42}$ are connected to transistor switches SWL and SWR respectively, as described above. The amplifier $A_{cm}$ amplifies only the common-mode part between the two inputs from nodes $V_{41}$ and $V_{42}$.

The output of amplifier $A_{cm}$ is connected via a line to node $V_5$ and via lines therefrom to the gates of the PMOS transistors MP2L and MP2R (where the "P" after the "M" signifies a P-channel device here and hereinbelow.)

The first left PMOS cascode current source includes two PMOS transistors MP2L and MP3L. The source of transistor MP2L is connected to the positive power rail $V_{DD}$. The drain of transistor MP2L is connected via line $V_7$ to the source of transistor MP3L to form the cascode structure. The gate of transistor MP2L is connected to node $V_5$ which is the output of amplifier $A_{cm}$. The current level of this PMOS current source is controlled by the voltage at node $V_5$. As a result, the current level is controlled by the amplifier $A_{cm}$. The gate of transistor MP3L is connected to the bias voltage $V_{b2}$ to bias the transistor MP3L working in the saturation region. The drain of transistor MP3L is connected to node $V_1$ to feed the current flowing from power line $V_{DD}$ in series through transistor MP2L and transistor MP3L to node $V_1$.

The first left NMOS cascode current source includes two NMOS transistors MN4L and MN2L. The source of transistor MN2L is connected to power rail $V_{SS}$ and the drain of transistor MN2L is connected via line $V_6$ to the source of transistor MN4L. The gate of transistor MN2L is connected to node $V_3$ which in turn is connected to the positive output of amplifier $A_{vd}$ (as described above) so the current level of the NMOS current source is controlled by $A_{vd}$. The gate of transistor NM4L is connected to bias voltage $V_{b3}$ to set transistor MN4L for working in the saturation region. The drain of transistor MN4L is connected to node $V_1$ to feed the current flowing from power line $V_{SS}$ in series through transistor MN2L and transistor MN4L to node $V_1$.

Since the positive input current $I_{i+}$ is also connected to node $V_1$, these three currents, $I_{i+}$, the current from power rail $V_{DD}$ through transistor MP3L and the current from power rail $V_{SS}$ through transistor MN4L are summed together at node $V_1$. Consequently, the input current $I_{i+}$ is sourced or sunk by the current from the transistor MP3L branch or the current from the transistor MN4L branch.

PMOS transistors MP2R and MP3R are the right half counterpart of transistor MP2L and transistor MP3L. (The last character "L" or "R" in the names of the transistors herein indicates a transistor device belonging to the left half part or the right half part of the drawing.)

The source of transistor MP2R is connected to the positive power rail $V_{DD}$ and the drain of transistor MP2R is connected via line $V_9$ to the source of transistor MP3R to form the cascode structure. The gate of transistor MP2R is connected to node $V_5$ which is the output of amplifier $A_{cm}$. The current level of this PMOS current source is controlled by the voltage at node $V_5$. As a result, the current level is controlled by the amplifier $A_{cm}$. The gate of transistor MP3R is connected to the bias voltage $V_{b2}$ to bias the transistor MP3R working in the saturation region. The drain of transistor MP3R is connected to node $v_2$ to feed the current flowing from power line $V_{DD}$ through transistor MP2R and transistor MP3R to node $V_2$.

The right half counterpart of NMOS transistor MN2L and transistor MN4L are transistor MN2R and transistor MN4R.

The source of transistor MN2R is connected to $V_{SS}$ and its drain is connected via line $V_8$ to the source of transistor MN4R. The gate of transistor MN2R is connected to node $V_4$ which is connected to the negative output of amplifier $A_{vd}$ so the current level of the NMOS current source if controlled by $A_{vd}$. The gate of transistor MN4R is connected to bias voltage $V_{b3}$ to have transistor MN4R working in the saturation region. The drain of transistor MN4R is connected to node $V_2$ to feed the current flowing from power line $V_{SS}$ through transistor MN2R and transistor MN4R to node $V_2$.

The key differences between the left and right half parts are the current summation node of the right half one, node $V_2$, is connected to the negative input of $A_{vd}$, node $V_{42}$, through the switch SWL and the gate of transistor MN2R, node $V_4$, is connected to the negative output current $I_{i-}$ is fed to node $V_2$ so that the current $I_{i-}$ is sourced or sunk by the current from transistor MP3R or the current from transistor MN4R.

The second left PMOS cascode current source is composed of transistor MP2L1 and transistor MP3L1. The source of transistor MP2L is connected to the positive power rail $V_{DD}$. The drain of transistor MP2L1 is connected via line $V_7'$ to the source of transistor MP3L1 to form the cascode structure. The operating principle is very similar to that of transistor MP2L and transistor MP3L described above except that the gate of transistor MP2L1 is connected to bias voltage $V_{b1}$ instead of node $V_5$ and the drain of transistor MP2L1 is connected to node $V_1'$ instead of $V_1$ where output current $I_{out1-}$ is provided. Since $V_{b1}$ is a constant bias, the current flowing from $V_{DD}$ to $V_1'$ through transistor MP2L1 and transistor MP3L1 is constant. Therefore, the transistor MP2L1 and transistor MP3L1 feed a constant bias current to the output $I_{out1-}$.

The right half counterparts of transistor MP2L1 and transistor MP3L1 are transistor MP2R1 and transistor MP3R1 (which transistors are connected in series through line $V_9'$) with their current fed to $I_{out1+}$. The source of transistor MP2R1 is connected to the positive power rail $V_{DD}$. The drain of transistor MP2R1 is connected via line $V_9'$ to the source of transistor MP3R1 to form the cascode structure. The gate of transistor MP2R1 is connected to bias voltage $V_{b1}$ instead of node $V_5$ and the drain of transistor MP3R1 is connected to node $V_2'$ instead of $V_2$ where output current $I_{out1+}$ is provided. Since $V_{b1}$ is a constant bias, the current flowing from $V_{DD}$ to $V_2'$ through transistor MP2R1 and transistor MP3R1 is constant. Therefore, the transistors MP2R1 and MP3R1 feed a constant bias current to the output $I_{out1+}$.

The third left PMOS cascode current source composed of transistor MP2L2 and transistor MP3L2 (which transistors are connected in series by line $V_7''$) operates similarly as the second one described above. The drain of transistor MP3L2 is connected to $V_1''$ to have the current fed to another output $I_{out2-}$. The right half counterparts are transistor MP2R2 and transistor MP3R2 (which transistors are connected in series through line $V_9''$) (which feed current to the positive output $I_{out2+}$.

The second left NMOS cascode current source is composed of transistor MN2L1 and transistor MN4L1 (which transistors are connected in series via line $V_6'$.) The gates of transistor MN4L1 and transistor MN4L are both connected to $V_{b3}$ and the gates of transistor MN2L and transistor MN2L1 are both connected to node $V_3$. Neglecting channel length modulation effect associated with MOS transistors, the currents flowing through these two cascode current sources are equal if their physical dimension are the same. Generally, these two cascode current sources are referred to as a cascode current mirror because they have the same current level. The drain of transistor MN4L1 is connected to node $V_1'$ to feed the current flowing from $V_{SS}$ through transistor MN2L1 and transistor MN2L1 to $V_1'$. Therefore, the current flowing through transistor MN2L and transistor MN4L is mirrored by transistor MN2L1 and transistor MN4L1 to the output $I_{out1-}$.

The right half counterparts of transistor MN2L1 and transistor MN4L1 are transistor MN2R1 and transistor MN4R1 (which are connected in series through line $V_8'$) with the current through those transistors fed to $I_{out1+}$. The gate of transistor MN4R1 is connected to $V_{b3}$, whereas the gate of the transistor MN2R1 is connected to node $V_4$. Transistor MN4R1 has its drain connected to node $V_2'$ to feed the current flowing from $V_{SS}$ through transistor MN2R1 and transistor MN2R1 to $V_2'$. Therefore, the current flowing through transistor MN2R and transistor MN4R is mirrored by transistor MN2R1 and transistor MN4R1 to the output $I_{out1+}$.

The third left NMOS cascode current source composed of transistor MN2L2 and transistor MN4L2 (which transistors are connected in series by line $V_6''$) operates similarly as the second one described above. The drain of transistor MN4L2 is connected to $V_1''$ to have the current fed to another output $I_{out2-}$.

The right half counterparts are transistor MN2R2 and transistor MN4R2 (linked by line $V_8''$) and the current is fed to the positive output $I_{out2+}$.

The CSH circuit operates in one of the two phases controlled by the clock CK; either the sample phase or the hold phase. In the sample phase, the left and the right hand switches SWL and SWR are both closed so that the nodes $V_1$ and $V_2$ are connected to $V_{41}$ and $V_{42}$ through the switches SWL and SWR, respectively. Then the common-mode part of the input signal $I_{i+}$ $I_{i-}$ is converted into the common-mode voltage $V_5$ by the amplifier $A_{cm}$. Because the amplifier $A_{vd}$ amplifies only the differential part between the voltages at the nodes $V_{41}$ and $V_{42}$, the voltages $V_3$ and $V_4$ are not changed by the common-mode part of the input signals. Since the output $A_{cm}$, on node $V_5$, is connected to the gates of transistor MP2L and transistor MP2R, the common-mode part of the input currents $I_{i-}$ and $I_{i+}$ can be sourced/sunk by the transistors MP2L and MP2R through transistor MP3L and transistor MP3R, respectively.

On the other hand, the differential part of the input currents is converted into the differential voltage signal between the nodes $V_3$ $V_4$ through the differential amplifier $A_{vd}$. Since the amplifier $A_{cm}$ amplifies only the common-mode part of the input nodes $V_{41}$ and $V_{42}$, the voltage at node $V_5$ is not affected by the differential part of the input signal. Because node $V_3$ and $V_4$ are connected to the gates of the transistors MN2L and MN2R respectively, the differential part of the input currents $I_{i-}$ and $I_{i+}$ can be sourced/sunk by the conduction of the transistors MN2L and MN2R, respectively.

That is, the differential part of input current $I_{i-}$ and $I_{i+}$ is mapped into the differences between the gate voltages of transistor MN2L and transistor MN2R while the common-mode part is mapped onto the gate voltage of the PMOS transistors MP2L or MP2R. The differential part of the input currents is sourced/sunk by the transistor MN2L and MN2R and are then reproduced by the cascode current mirror pairs (MN2L, transistor MN4L, transistor MN2L1, and transistor MN4L1) and (MN2R, transistor MN4R, transistor MN2R1, and transistor MN4R1.) The common-mode part of the input currents is sourced/sunk by the transistors MP2L and MP2R. Because only the differential part of the input current is mirrored to the output branches, the common-mode part is, therefore, rejected.

Multiple-outputs for driving multiple-loads can be obtained by simply adding additional cascode current mirrors as the transistors MN2L2, MN4L2, MP3L2 and MP2L2 on the left and MN2R2, MN4R2, transistor MP3R2 and transistor MP2R2 on the right shown in FIG. 1.

Once the circuit has settled down to the required accuracy, the sampling switches SWL and SWR can then be turned off. Since the voltages at nodes $V_{41}$ and $V_{42}$ have been "memorized" by the charges stored on the capacitors $C_1$ and $C_2$ associated with those two nodes, the voltages at $V_3$ and $V_4$ are also kept unchanged through the amplifier $A_{vd}$. Therefore, output current will be the same as that sampled during the sample phase. That is, the differential part of the input current has been sampled and held while the common-mode part is removed.

In fact, the turning off transients of the switches SWL and SWR introduce some error charges to the data storage nodes $V_{41}$ and $V_{42}$. (This kind of error is called clock feedthrough error.) However, the common-mode part of the error is not amplified by the differential amplifier $A_{vd}$. Consequently, the common-mode part of the switch induced error can be canceled in the same way as the rejection of the common-mode part of the input currents.

Figure 2:
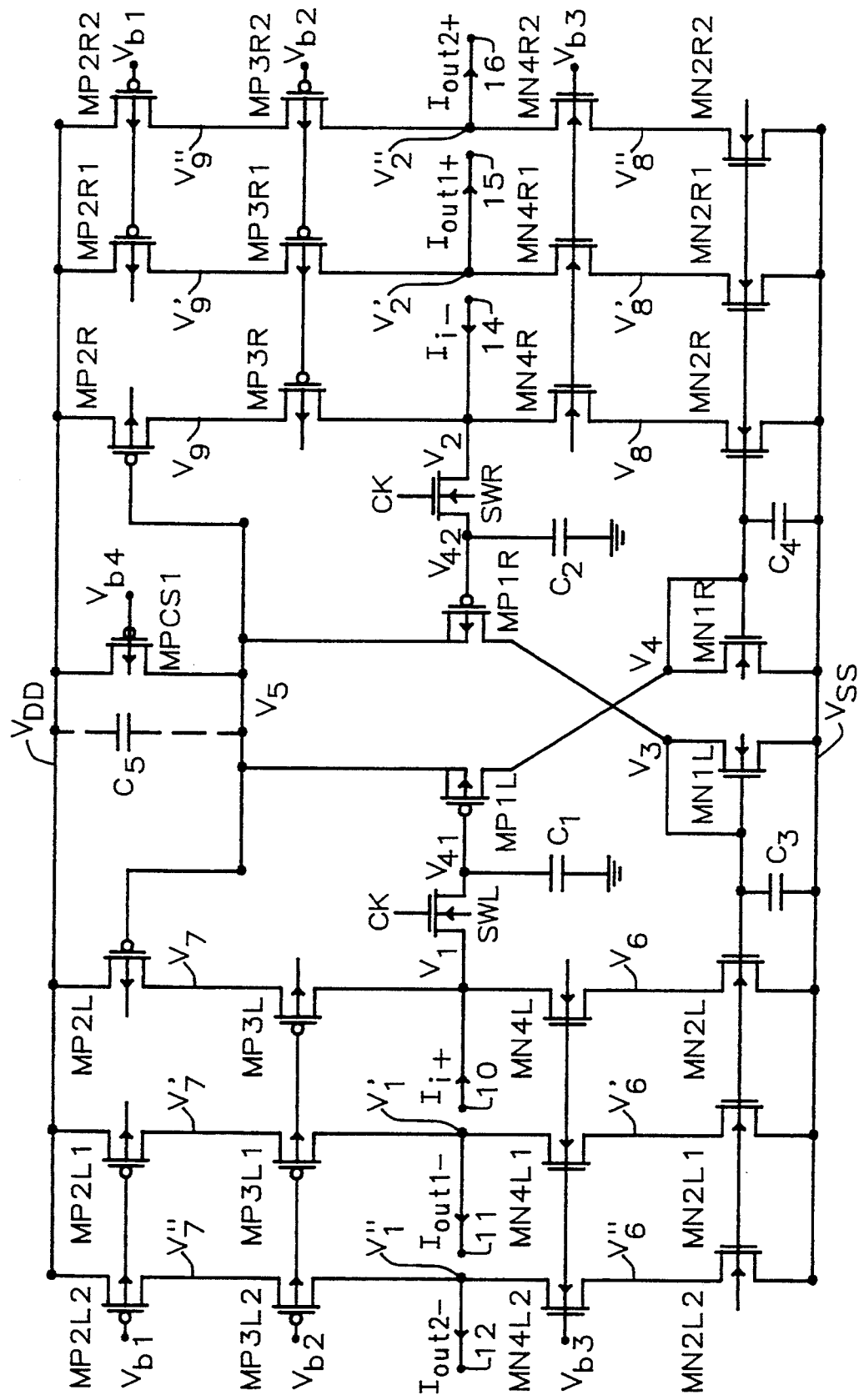
FIG. 2 shows the circuit diagram of the CSH of FIG. 1 in greater detail.

FIG. 2 depicts a more detailed circuit diagram of the CSH circuit of FIG. 1. Transistor MPCS1 has its source drain circuit connected between power rail $V_{DD}$ and node $V_5$. Transistor MP1L has its source drain circuit connected between node $V_5$ and node $V_4$. Transistor MP1R has its source drain circuit connected between node $V_5$ and node $V_3$. To save power and chip area and to increase the operating speed of the circuit, only five transistors are used to implement the two amplifiers $A_{vd}$ and $A_{cm}$ by sharing as many components between them as possible. The source-coupled PMOS transistor pair MP1L and MP1R and the current source (PMOS transistor) MPCS1 function not only as the common-mode amplifier $A_{cm}$, but also serve as the differential input stage for the differential amplifier $A_{vd}$. The sources of transistors MP1L and MP1R are connected to node $V_5$. The drain of transistor MP1L is connected to node $V_4$. The gate of transistor MP1L is connected to node $V_{41}$. The drain of transistor MP1R is connected to node $V_3$, while node $V_{42}$ is connected to the gate of transistor MP1R. Line $V_{b4}$ which is connected to the gate of transistor MPCS1 provides a bias voltage to control the current flowing through transistor MPCS1. With the addition of two extra NMOS transistors MN1L and MN1R, the amplifier $A_{vd}$ is also be embodied in this circuit. The sources of transistor MN1L and transistor MN1R are connected to power rail $V_{SS}$ and the drains of transistor MN1L and transistor MN1R are connected to nodes $V_3$ and $V_4$ respectively. The gate of transistor MN1L is connected to node $V_3$. The gate of transistor MN1R is connected to node $V_4$. It can be shown that $$A_{cm} \approx 1 \text{ and } A_{vd} \approx \frac{(g_m, MP1L)}{(g_m, MN1L)}$$

where $g_m$ is the transconductance of MOS transistors.

The voltage amplifiers $A_{vd}$ and $A_{cm}$ constructed by transistor MN1L, transistor MN1R, transistor MP1L, transistor MP1R and transistor MPCS1 also provides a good isolation from the high impedance data storage nodes $V_{41}$ and $V_{42}$ to the output nodes.

The current gains of the CSH can be shown as follows:

$$A_{id} = A \text{ where } A = \frac{(W/L)MN2L1}{(W/L)MN2L} = \frac{(W/L)MN4L1}{(W/L)MN4L}$$

$$A_{cs} = \left(\frac{g_{d,MPCS1}}{g_{m,MP2L}}\right)\left(\frac{g_{m,MN2L1}}{g_{m,MN1L}}\right)$$

Where $$A_{id} \equiv \frac{I_{out,d}}{I_{in,d}} \text{ (differential current gain)}$$

$$A_{cs} \equiv \frac{I_{out}^*}{I_{in,CM}} \text{ (single-ended common-mode gain)}$$

$I_{out}^*$: $I_{out+}$ (or $I_{out-}$) when $I_{i+} = I_{i-} = I_{in,CM}$
$I_{out,d} \equiv I_{out+} - I_{out-}$ (differential-mode output current)
$I_{in,d} \equiv I_{i+} - I_{i-}$ (differential-mode input current)

$$I_{in,CM} \equiv \left(\frac{I_{i+} - I_{i-}}{2}\right) \text{(common-mode input current)}$$

$g_{d,MPCS1}$ = output conductance of transistor MPCS1
$g_{m,MP2L}$ = transconductance of transistor MP2L Since the current mirrors are of the balanced cascode configuration, the output resistance is increased to be $(g_m^* r_d) r_d$. Therefore, the differential current gain $A_{id}$ is determined primarily by the dimension ratio between the mirror-transistors MN2L and MN2L1. The input resistance $R_{in}$ for the differential-mode input is as follows:

$$R_{in} = \left(\frac{1}{A_d}\right)\left(\frac{1}{g_{m,MN2L}}\right)$$

while that for common mode input is $$\left(\frac{1}{g_{m,MP2L}}\right)$$

To analyze the settling behavior, the CSH circuit can be treated as a fully differential voltage amplifier with a unity gain feedback (through the feedback switches SWL and SWR) when it operates in the sample phase. Therefore, the settling behavior of the CSH circuit can be analyzed from the open-loop, S-domain transfer function of the voltage amplifier. The open loop transfer function $A_{vx}(s)$ of the voltage amplifier can be approximately expressed as:

$$A_{vx}(S) \approx \left(\frac{A_{xo}}{\left(1 + \frac{s}{w_1}\right)\left(1 + \frac{s}{w_2}\right)}\right) \quad (1)$$

where $$A_{vx}(S) \equiv \left(\frac{V_1(S) - V_2(S)}{V_{41}(S) - V_{42}(S)}\right) \quad (2)$$

when the feedback switches SWL and SWR are opened and and $$A_{xo} \equiv \left(\frac{(g_m)MP1L}{(g_m)MN1L}\right)(g_m r_d)MN4L(g_m r_d)MN2L. \quad (3)$$

The first pole $W_1$ of the transfer function is $$W_1 \approx \frac{1}{(g_m r_d)MN4L * r_{d,MN2L} * C_1} \quad (4)$$

where $C_1$ is the capacitance load at node $V_{41}$. The second pole $W_2$ is $$W_2 \approx \frac{(g_m MN1L)}{C_3} \quad (5)$$

where $C_3$ is the capacitance load at the node $V_3$. Assume $W_2 > W_1$, the unity gain frequency $W_o$ can be derived as $$W_o \approx A_{xo} W_1 \approx \left(\frac{(g_{m,MP1L})}{(g_{m,MN1L})}\right)\left(\frac{(g_{m,MN2L})}{C_1}\right), \quad (6)$$

Combining (5) and (6), it can be shown that $$\frac{W_2}{W_o} = \left(\frac{(g_{m,MP1L})}{g_{m,MP1L}}\right)\left(\frac{(g_{m,MN1L})}{(g_{m,MN2L})}\right)\left(\frac{C_1}{C_3}\right) \quad (7)$$

In this design

-continued $$\left(\frac{g_{m,MP1L}}{g_{m,MP1L}}\right) \approx 1, \left(\frac{g_{m,MN1L}}{g_{m,MN2L}}\right) \approx 1,$$

and $C_3$ is about 3 pf (4 output current mirrors.) Based on (7) the CSH circuit can have a good settling behavior and a high sampling rate by simply adding two compensation MOS capacitors $C_1$ and $C_2$ of about 10 pf to the high impedance nodes $V_{41}$ and $V_{42}$, respectively.

The experimental chip embodying the CSH circuit has been designed and fabricated by a 1.2 μm double poly, double metal, N-well CMOS processes.

The experimental results are summarized in Table I. The maximum sampling rate is 15M sample/sec. (with four output loads.) The differential linear input range is from −500 μA to 500 μA. The common-mode linear input range is from −450 μA to 400 μA which confirms the validity of the current-mode common-mode feedback. The common-mode current gain if 0.02 whereas the common-mode to differential gain is 0.002. The clock feedthrough error measured is less than 1 μA for all input current levels. These results are achieved by the fully-differential architecture and the common-mode rejection capability. Due to the mismatching between mirror-transistors, the gain accuracy is limited to 8-bits. Though the process provides linear capacitors, only MOS transistors were used in the experimental chip. Therefore, the circuit has proven to be fully compatible with standard digital processes. According to the measurement results, the CSH (current S/H) circuit can operate 15M sample/sec with an 8-bit resolution. The experimental results show good agreement with simulation results.

TABLE I

| Experimental Results of current S/H circuit | |
|---|---|
| Sampling Speed | 60 ns (8-bit accuracy) |
| Gain Accuracy | 8-bit |
| differential input range | −500 μA~500 μA |
| common-mode input range | −450 μA~450 μA |
| clock feedthrough error | less than 1 μA |
| $A_{cm \to cm}$ (common-mode to common-mode gain) | 0.02 |
| $A_{cm \to dm}$ (common-mode to differential-mode gain) | 0.002 |
| input resistance | 750 Ω |
| output resistance | $10^6$ Ω |
| power consumption | 15 mW |

*with four outputs in this test chip

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An electronic system comprising
   a) a pair of input nodes,
   b) common mode amplifier means having a pair of input lines with each one connected to one of said input nodes, said common mode amplifier means having a single output,
   c) differential voltage amplifier means having a pair of input lines each being connected to one of said input nodes, said differential amplifier means having a first output line with a negative polarity and a second output line with a positive polarity,
   d) a first pair of current circuits including a first current source circuit and a second current source circuit with said output of said common mode amplifier means being connected to a corresponding input of each of said first and second current circuits, a second pair of current circuits including a third current source circuit and a fourth source current circuit,
   e) said first output line of said differential amplifier means with a negative polarity being connected to said third current source circuit, and
   f) said second output line of said differential amplifier means with a positive polarity being connected to said fourth current source circuit, whereby the common mode signal is rejected at said input nodes.

2. An electronic system in accordance with claim 1 wherein each of said input nodes is connected through a switch to one of a set of signal sources.

3. An electronic system comprising
   a) a pair of input nodes for carrying input current,
   b) common mode amplifier means having a pair of input lines with each one connected to one of said input nodes, said common mode amplifier means having a single output,
   c) differential voltage amplifier means having a pair of input lines each being connected to one of said input nodes, said differential amplifier means providing outputs on first and second output lines with absolute values varying as a function of the voltage difference between said input nodes, said first output line having an output with a negative polarity and said second output line having an output with a positive polarity,
   d) a pair of current source circuits including a first current source circuit and a second current source circuit with said output of said common mode amplifier means being connected to a first input of each of said first and second current source circuits,
   e) said first output line of said differential amplifier means with said negative polarity being connected to a second input of said first current source circuit, and
   f) said second output line of said differential amplifier means with said positive polarity being connected to a second input of said second current source circuit, whereby the common mode signal is rejected at said input nodes.

4. An electronic system in accordance with claim 3 wherein each of said input nodes is connected through a switch to one of a set of signal sources.

5. An electronic system in accordance with claim 3 wherein each of said input nodes is connected to one of a set of current sources.

6. An electronic system in accordance with claim 3 wherein said pair of current source circuits, each include a PMOS cascode current source and an NMOS cascode current source connected in series.

7. An electronic system in accordance with claim 3 wherein said pair of current source circuits, each include a PMOS cascode current source and an NMOS cascode current source connected in series, and with said PMOS cascode current sources having inputs connected to the output of said common mode amplifier.

8. An electronic system in accordance with claim 3 wherein said pair of current source circuits, each include a PMOS cascode current source and an NMOS cascode current source connected in series, and with said PMOS cascode current sources having inputs connected to the output of said common mode amplifier and with said NMOS cascode current sources having inputs connected to the opposite outputs of said differential voltage amplifier.

9. An electronic system in accordance with claim 4 wherein each of said input nodes is connected to one of a set of current sources.

10. An electronic system in accordance with claim 4 wherein said pair of current source circuits, each include a PMOS cascode current source and an NMOS cascode current source connected in series.

11. An electronic system in accordance with claim 4 wherein said pair of current source circuits, each include a PMOS cascode current source and an NMOS cascode current source connected in series, and with said PMOS cascode current sources having inputs connected to the output of said common mode amplifier.

12. An electronic system in accordance with claim 4 wherein said pair of current source circuits, each include a PMOS cascode current source and an NMOS cascode current source connected in series, and with said PMOS cascode current sources having inputs connected to the output of said common mode amplifier and with said NMOS cascode current sources having inputs connected to the opposite outputs of said differential voltage amplifier.

13. An electronic system comprising a) a pair of input nodes for carrying input current, b) common mode amplifier means having a pair of input lines with each one connected to one of said input nodes, said common mode amplifier means having a single output, c) differential voltage amplifier means having a pair of input lines each being connected to one of said input nodes, said differential amplifier means providing outputs on first and second output lines with absolute values varying as function of the voltage difference between said input nodes, said first output line having an output with a negative polarity and said second output line having an output with a positive polarity, d) a pair of current source circuits including a first current source circuit and a second current source circuit with said output of said common mode amplifier means being connected to a corresponding input of each of said first and second current source circuits, e) said first output line of said differential amplifier means with said negative polarity being connected to an input of a third current source circuit, f) said second output line of said differential amplifier means with said positive polarity being connected to an input of a fourth current source circuit, and g) each of said input nodes is connected to one of a set of current sources, whereby the common mode signal is rejected at said input nodes.

14. An electronic system in accordance with claim 13 wherein each of said input nodes is connected to one of said current source circuits including a PMOS and an NMOS cascode current source connected in series.

15. An electronic system in accordance with claim 13 wherein each of said output lines is connected to one of said current source circuits including a PMOS and an NMOS cascode current source connected in series.

16. An electronic system in accordance with claim 14 wherein each of said output lines is connected to one of said current source circuits including a PMOS and NMOS cascode current source connected in series.

17. An electronic system in accordance with claim 13 wherein each of said input nodes is connected to one of said current source circuits including a PMOS and an NMOS cascode current source connected in series, and with said PMOS cascode current sources having inputs connected to the output of said common mode amplifier.

18. An electronic system in accordance with claim 13 wherein said pair of current source circuits, each include a PMOS cascode current source and an NMOS cascode current source connected in series, and with said PMOS cascode current sources having inputs connected to the output of said common mode amplifier and with said NMOS cascode current sources having inputs connected to the opposite outputs of said differential voltage amplifier.

19. An electronic system in accordance with claim 18 wherein each of said output lines is connected to one of said current source circuits including a PMOS and an NMOS cascode current source connected in series.

\* \* \* \* \*